United States Patent [19]

Schnaibel et al.

[11] Patent Number: 4,689,554

[45] Date of Patent: Aug. 25, 1987

[54] TEST APPARATUS FOR ELECTRONIC CONTROL SYSTEMS, PARTICULARLY AUTOMOTIVE-TYPE COMPUTERS

[75] Inventors: Eberhard Schnaibel, Hemmingen; Erich Schneider, Kirchheim, both of Fed. Rep. of Germany

[73] Assignee: Robert Bosch GmbH, Stuttgart, Fed. Rep. of Germany

[21] Appl. No.: 772,724

[22] Filed: Sep. 4, 1985

[30] Foreign Application Priority Data

Oct. 10, 1984 [DE] Fed. Rep. of Germany ....... 3437149

[51] Int. Cl.[4] .................... G01R 31/28

[52] U.S. Cl. .................... 324/73 R; 324/158 R

[58] Field of Search .................... 178/69 G; 324/73 R, 324/158 R; 329/106; 340/353, 792, 814; 375/22

[56] References Cited

U.S. PATENT DOCUMENTS

| | | | |
|---|---|---|---|
| 3,369,230 | 2/1968 | Brown | 340/353 |
| 3,471,639 | 10/1969 | Centanni | 340/353 |
| 3,644,677 | 2/1972 | Cecchin et al. | 375/22 |
| 3,753,135 | 8/1973 | Kastner et al. | 329/106 |
| 3,949,199 | 4/1979 | Odom | 375/22 |
| 4,207,524 | 6/1980 | Purchase | 375/22 |
| 4,219,890 | 8/1980 | Sugihara | 375/22 |
| 4,355,215 | 10/1982 | Legras et al. | 178/696 |
| 4,358,761 | 11/1982 | Iwasaki | 340/792 |

FOREIGN PATENT DOCUMENTS

| | | | |
|---|---|---|---|
| 2070779 | 9/1981 | United Kingdom | 324/73 R |

*Primary Examiner*—Reinhard J. Eisenzopf
*Assistant Examiner*—W. Burns
*Attorney, Agent, or Firm*—Frishauf, Holtz, Goodman & Woodward

[57] ABSTRACT

To provide an inexpensive test apparatus for testing the performance of control computers in automotive vehicles, for example sufficiently simple to be affordable by gasoline service stations, small garages and the like, a shift register-memory combination unit is provided receiving the data in serial, preferably Pulse-Duration-Modulated (PDM), form, and a monostable flip-flop is connected to the shift register, connected to be SET by a flank, preferably the trailing flank, of the first bit of a data word, and having a timing period somewhat longer than the longest interval between sequential bits, the monostable flip-flop being connected to control the shift register to transfer data in the shift register to a memory section thereof for simultaneous display of the data in the various storage locations of the memory section of the shift register. A counter can be used to inhibit application of clock pulses to the shift register beyond a predetermined count so that only those data which have been transmitted up to the inhibit count will be stored in the shift register for subsequent display.

11 Claims, 2 Drawing Figures

TEST APPARATUS FOR ELECTRONIC CONTROL SYSTEMS, PARTICULARLY AUTOMOTIVE-TYPE COMPUTERS

Test apparatus of the known type usually include a computer chip or component which permits complex evaluation according to various determined logic algorithms of the serially derived data. The evaluation result is displayed on a cathode ray tube or screen, or can be printed in a printer. Such test apparatus, of course, is very expensive, so that it can be obtained and used only in large repair installations, or by manufacturers of the equipment.

THE INVENTION

It is an object to provide a test apparatus which permits testing of computer-type control apparatus, and more particularly of automotive-type computers, which is simple, inexpensive, and thus within reach of most repair shops, and which can be easily operated without requiring special knowledge of computer apparatus and its application.

Briefly, a shift register with a memory is provided, which is connected to a data input port which, in turn, receives data from a similar serial data output port of the computer apparatus to be tested, typically an automotive microcomputer. The data input port reads the data and stores the read data. A monostable flip-flop, having a predetermined timing period is provided, which recognizes the termination of data transmission to the shift register, the monostable flip-flop being coupled to shift register to control the shift register, and then to transfer the stored data to a display device which may be a screen, a printer or the like. Preferably, the monostable flip-flop (FF) has a timing period which differs from the rate of data transmission, and which, in another embodiment of the invention, may be coupled to a counter, so that a predetermined number of serially occurring data can be checked. Thus, the shift register need not have the full capacity of all the data available, but series of data can be checked sequentially.

The output display device can be a very simple numerical display, or may include a printer, for example merely indicating which one of the data read into the shift register, and shifted through the shift register, have a certain characteristic - for example indicative of a malfunction, the output then being checked against a handbook, or instruction manual.

The system of the present invention has the advantage that a simple test apparatus is capable of checking electronic control apparatus, the simple apparatus being inexpensive and requiring only few structural components. It is, however, still possible to check the electronic computer control apparatus with respect to defects therein or connections thereto. Since the test apparatus is simple, it can be made inexpensively, so that small repair shops, gasoline stations, and the like, or self-repairers and tinkerers with automotive equipment can afford the test apparatus. The system in accordance with the present invention is not controlled by the computer, and can readily be constructed of commercially available computer components.

In accordance with a preferred feature of the invention, a low-pass filter is installed ahead of the data input to the shift register. This low-pass filter insures error-free operation even if the serial data are so designed that they, simultaneously, form a transmission element for clock pulses. The low-pass filter can then be used to unambiguously separate clock pulses and data. In accordance with a preferred feature of the invention, a controllable counter is used which can be operated by the monostable FF, the counter state of which is changed by the clock pulses and, when a predetermined counter state is obtained, the clock pulse to the shift register is suppressed, thus simulating to the shift register termination of transmission. This extension of the apparatus permits checking serial data which are extremely long, and which exceed the storage capacity of the shift register, to obtain the error code in sections, in that only so many data are entered into the shift register as can be displayed. Suppression of the clock pulses can easily be obtained by controlling a diode which is connected into the clock pulse line and, when a predetermined counter state is reached, connecting the diode to ground or chassis, or to a virtual ground or reference potential. A counter output terminal, usually present on such counters, can be used for connection of the diode. Preferably, filters are also used to suppress stray or noise pulses.

The counter, for example, can be set to a predetermined count state, and controlled to count down, and when the count state "zero" is reached, the counter then providing an output signal to control the diode to become conductive and thus inhibit transmission of further clock pulses to the shift register.

DRAWINGS

FIG. 1 is a general circuit diagram of the test apparatus and system in accordance with the present invention; and FIG. 2, in timed graphs a to d, shows pulse diagrams used in connection with the explanation of the operation of the system.

DETAILED DESCRIPTION

Figure 1:
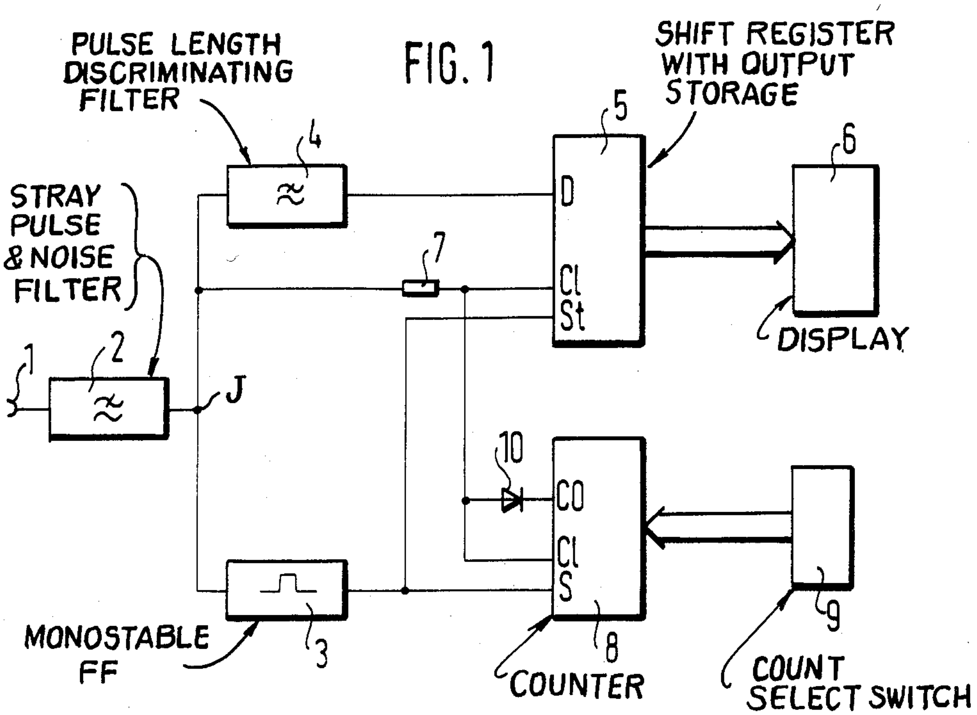

FIG. 1 shows the basic construction of a simple test apparatus. The input port or terminal 1 is connected to receive serial data output of the control apparatus to be tested (not shown), for example a control apparatus to supervise and control the ignition instant in an automotive vehicle, fuel injection, or other function in a vehicle. Data received at terminal 1 are applied over a low-pass filter 2, which is so designed that it does not falsify the data flow, but suppresses steep flank noise or interference pulses to a junction J, at which the data flow divides. One branch of the data is applied to a monostable flip-flop (FF) 3; another branch goes to a low-pass filter 4. Junction J is further coupled to a resistor 7. The output of the low-pass filter 4 is connected to the data input of a shift register having output storage capability inherently therein. The shift register 5 includes a memory address for each register section; a suitable integrated circuit which is capable of carrying out this function is the element 4094 by RCA.

The branch from junction J through the monostable FF 3 is connected to the strobe input St of the shift register 5. The output from the FF 3 is,further, connected to the self-clocked SET input S of a counter 8. The counter 8 may be the integrated circuit 40103 by RCA. The junction J is further connected through a resistor 7 to the clock input C1 of the shift register 5. The output of the resistor 7 is further connected to the clock input C1 of the counter 8, and to the cathode of a diode 10. The anode of the diode 10 is connected to the overflow output C0 of the counter 8.

The output of the memory from the shift register 5 is connected over a data bus with a display device 6 which, for example, may be an array of light emitting diodes or a seven-segment alphanumeric display. The data input of the counter 8 is connected via a count data line with a switch 9 which permits a count selection of the count state of the counter, from which the counter can count down or can count up and, when the count state is reached, provides an output signal at the terminal C0.

Figure 2:
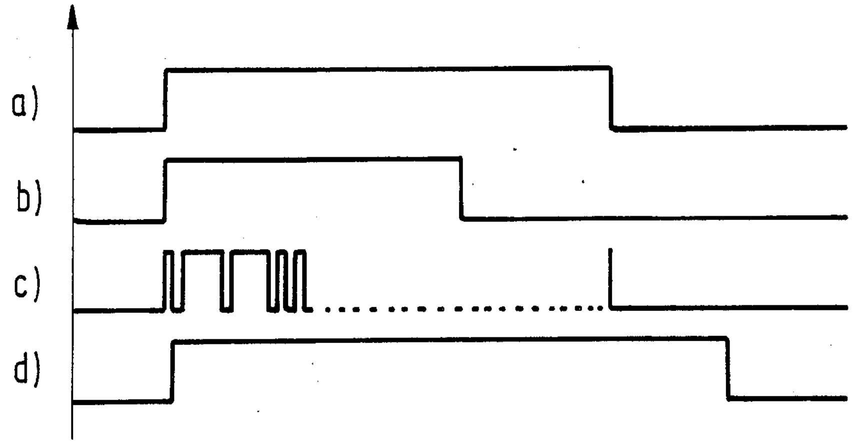

Operation—with reference to FIG. 2: Depending on the construction of the control apparatus coupled to terminal 1, some modification of the system of FIG. 1 may be required. For example, if the data and clock signals are separately connected from the control apparatus or system, it is possible to connect the data signals directly to the data input D of the shift register 5 and to provide only the clock signals to the terminal 1. If a code is used for serial data transmission from which the clock signal can be regenerated, then the system of FIG. 1, exactly as shown, is preferably used. Thus, for alternative connection, the filter 4 could be provided, connected to a transfer switch which, selectively, connects the filter 4 to the data input D of the shift register—memory combination 5 or which connects a serial data output—without clock signal recognition—alternatively directly to the data input D.

The description, as it proceeds, will be based on a data transmission which includes clock information, from which the clock information can be regenerated, which is the more complex mode of operation; the simpler mode of operation will then also be clear.

After data signals have passed through the filter 2, to be filtered with respect to high-frequency noise or disturbance pulses, the signals are applied from junction J to the low-pass filter 4. The noise pulses may, for example, occur due to the operation of the ignition system of a motor vehicle of which the apparatus to be tested is a part. The low-pass filter 4 separates the clock signals from the data signals and is so constructed that the length of the pulses before the trailing flank is investigated. The low-pass filter 4, thus, may be constructed by charging a capacitor through a resistor. If the pulse is relatively long, a logic 1-signal is recognized; if the pulse is relatively short, the capacitor will not be charged to a sufficiently high level and a logic 0-signal is recognized. Recognition of the logic 1 or logic 0-state based on the charge state of such a capacitor can be easily done by a threshold circuit, checking for the charge state of the capacitor, and serially connected to or forming part of the low-pass filter. The state of the threshold circuit, whether a 0-state or 1-state,is then evaluated at the input D of the shift register 5 at the clock time instant. In simple cases, a suitable comparator input at the data input D of the shift register 5, discriminating with respect to voltage levels, may be used.

The clock input C1 of the shift register 5 is a dynamic input which reacts to the trailing flank of the signal from resistor 7. Upon occurrence of the trailing flank of a data signal, the signal applied to the data input D is transferred into the shift register 5 and stored at the last place of the shift register. The previously read data are shifted down in the shift register. The data reaching the final or terminal point of the shift register are lost.

The monostable FF 3, for which the integrated circuit 4098 of RCA is suitable, is triggered by the negative flanks of signals at junction J and derived from the data input terminal 1. The switching time or time period or time constant of the monostable FF 3 is to be so selected that it is shorter than the shortest pause which may occur between two data sequences, yet longer than the minimum transfer rate of the serial data flow. When the data transmission is terminated, and after a predetermined pause time, the monostable FF 3 will reset with a pulse having a negative flank. This pulse is applied to the strobe input St of the shift register 5. The content of the data stored in the shift register 5 are then transferred into the memory portion of the shift register 5, and, simultaneously, the display unit 6 is connected to the memory portion.

The display unit, now, will provide a display, for example based on a displayed number, a specific light emitting diode (LED) pattern or the like,which indicating error—if any—is present in the control system from which the data flow at terminal 1 has been derived. For example, if the display 6 has eight LEDs, an error could be determined if, for example, one will look in a handbook or instruction booklet which malfunction is caused by second and seventh LED being lit.

The display unit 6 may also be a segmental alphanumeric display. For example, numbers and letters could be directly displayed, and the user of the test apparatus, upon perceiving the number 6 or the letter A, can then easily check which malfunction in the control system will cause the respective number or letter to be displayed. Any combination of output in alphanumeric form may of course be used.

The foregoing operation assumes that only as many data are being transmitted as can be stored in the shift register 5. In accordance with a feature of the invention, it is possible to expand the utility of the test apparatus by utilizing the counter 8 and the control switch 9, forming a count selection switch therefor, without substantially increasing the cost of the apparatus.

FIG. 2, graph a, illustrates—in form of a logic 1—the transmission time period during which the data are transmitted to the terminal 1 from the control apparatus (not shown). Only the last transmitted data are displayed, that is, the data which correspond to the capacity of the shift register 5 and the display unit 6. If all the data, that is, also the initially transmitted data—which got lost upon shifting through a number of places which exceeds the storage location of the unit 5—are to be displayed, the data are indicated sequentially, in sections. If, for example, only specific data are of interest, they can be selected by means of the counter for special display.

Graph b of FIG. 2 shows a data group which begins, during the data transmission, somewhere in the middle. By means of the circuit 9, the counter 8 is so set that the count state or counting sequence of the counter is interrupted at a predetermined count state or time instant. The count state which is entered by the selector switch 9, for example a toggle switch array, is introduced into the counter 8 with the SET pulse, which is applied to the SET input S. The positive flank is used as the SET pulse, that is, that flank with which the monostable FF 3 is set by the first data pulse to a logic 1-state. FIG. 2, graph d, illustrates this condition. As can readily be seen, the first trailing flank of the data signal—see graph c—of FIG. 2, which is applied to the input 1 of the apparatus, causes the monostable FF 3 to be SET. Each further clock pulse, which is applied to the clock pulse input C1 of the counter resets the counter 8 by a value of one. If the number of clock pulses have passed which correspond to the predetermined counter state, set into the counter by the count selection switch 9, the counter will reach state zero, assuming the counter to count down or backwards. At the count state zero, the transfer output CO will be reset to a logic 0. Further clock pulses which are applied over the resistor 7 to the clock input of the counter 8, or to the shift register 5, will no longer be evaluated since the diode 10 will clamp the clock line to a logic 0 so that any data which are applied to the shift register are no longer received thereby, as illustrated in graph b of FIG. 2 with the trailing flank.

FIG. 2, graph c, illustrates, further, the digital serial data transmission in which the transfer of the data bits is done by the trailing flank. The low-pass filter 4 permits recognition of the data word. If the pulse is short, so that the capacitor in the low-pass filter 4 cannot be sufficiently charged, a logic 0 is recognized. If the pulse is long, as illustrated in the second pulse of graph c, a logic 1 is recognized. The data word shown in FIG. 2, thus, will be 01100. The trailing flank of the diagram in accordance with graph b illustrates the termination of the data transmission. The low-pass filter 4 may receive further data, but the clock signal, which has been blocked or terminated by the diode 10, will prevent transfer of these data into the shift register.

The element 4 need not be constructed as a low-pass filter in form of a capacitor-resistor network; this is only one way to evaluate the length of any bit. The length of the data signal can be determined otherwise, for example by a counter. The transmission rate can be suitably selected, particularly when the data evaluation, that is, the length of any one bit to determine if it has 1-value or 0-value, is done by counting with respect to a predetermined clock rate which could be suitably selected. The clock rate can be selected to be faster or slower. It is only necessary to be careful that the low-pass filter 4—or its equivalent—can reliably discriminate between a logic 0 and a logic 1, that is, the difference in pulse length between a logic 0 and a logic 1 must be sufficiently great. The sequences of the trailing flanks, which determine the clock rate, are selectable in wide ranges. A limit is determined only by the monostable FF 3 which recognizes that, after a predetermined time after which no pulses are received, the data transmission is terminated. The clock sequence, thus, must not be shorter than the time of gaps between data transmissions.

Graph d of FIG. 2 illustrates the operation of the monostable FF 3. The first trailing flank causes the monostable FF 3 to SET; at the same time, the counter receives the numerical value set into the count select switch 9. The FF 3 is re-triggered by each negative flank, that is, it will remain at its 1-signal or SET condition. After the last negative flank—see graph c of FIG. 2—the monostable FF 3 will remain during its predetermined triggering time on the logic 1-level and then will drop off back to the logic 0-level. This drop-off from a logic 1 to a logic 0 simultaneously triggers the strobing pulse which is transmitted to the shift register—memory unit 5 to transfer the shift register content in the memory thereof and, at the same time, cause display of the memory content. The timing duration of timing period of the monostable FF 3, suitably, is so selected that if the data transmission is slow, it will not respond due to lacking clock pulses and, on the other hand, after termination of the data transmission, the result of the test is available in a reasonable time on the display 6. The timing duration of the monostable FF 3, thus, must be matched to the data transmission rates and characteristics of the control apparatus which is to be tested, that is, which is to be connected to terminal 1.

Various changes and modifications may be made within the scope of the inventive concept.

We claim:

1. Test apparatus, for testing electronic control systems providing clock signals and test data words as a combined serial data stream, having a serial data input port (1);

a display device (6);

and comprising, in accordance with the invention, a combination shift-register-and-memory unit (5) having a clock input (Cl) and a data input (D) connected to the serial data input port (1) for receiving and reading data, and for storing data;

means (4), connected between said serial data input port (1) of said test apparatus and said data input (D) of said combination unit (5), for separating said combined serial data stream into clock signals and test data in the form of a sequence of logical zero and logical one signals, said means (4) applying said test data to said data input (D) for sequential shifting thereof, in synchronism with said clock signals, into a shift register portion of said combination unit;

a retriggerable monostable flip-flop (3) which is connected to receive said test data and has a timing period selected to detect the end of each data word and thereby recognize termination of data transmission to the shift-register-and-memory unit (5), the monostable flip-flop (3) having an output coupled to an input of the shift register other than said data input (D) and controlling the shift-register-and-memory unit (5) to transfer shifted data from said shift register portion of said combination unit (5) into a memory portion thereof and to display the data stored in the memory portion.

2. Test apparatus according to claim 1, wherein the monostable flip-flop (3) has a timing period which is longer than the longest gap, between sequential bits of serial data, expected to be applied to the input port to reliably recognize termination of a data word applied to the serial data input port.

3. Test apparatus according to claim 1, wherein said means for separating and applying comprises a low-pass filter means (4) connected to the data input (D) of the combination shift-register-and-memory unit (5).

4. Test apparatus according to claim 1, further including a controllable counter (8) connected to the output of the monostable flip-flop (3) to be SET thereby, the counter changing counter state in accordance with a clock rate of the data words applied to the input port (1), said counter providing a count output signal (CO) at a predetermined count state, and means for connecting the count output signal to the shift register, said means suppressing further application of clock pulses to the combination shift register—memory unit (5).

5. Test apparatus according to claim 4, wherein said connection means comprises a diode (10) coupled to the clock input of the shift register—memory unit combination (5) and connected by the count output of the counter (CO) to connect the clock input of the combination shift register—memory output unit to a reference voltage.

6. Test apparatus according to claim 1, further including a noise or stray pulse suppression filter (2) connected serially to the data input port (1).

7. Test apparatus for combination with control apparatus for controlling functions in an automotive vehicle, said control apparatus providing data in serial form, said test apparatus comprising the apparatus claimed in claim 1, and said data in serial form being connected to the serial data input port (1).

8. Test apparatus according to claim 1, wherein said combined data stream is a train of self-clocked digital pulses, an output of said means (4) for separating is a voltage signal whose level depends upon the duration of the most recent pulse, and said clock input of said combination unit (5) is responsive to a flank of each pulse is said pulse train.

9. Test apparatus according to claim 8, wherein said means (4) for separating comprises a resistor and a capacitor in series.

10. Test apparatus according to claim 3, wherein said low-pass filter means (4) comprises a resistor and a capacitor in series.

11. Test apparatus according to claim 1, wherein said combination unit (5) has a strobe input (St) and the output of said monostable flip-flop (3) is connected thereto.

* * * * *